United States Patent
Hsu et al.

(10) Patent No.: US 8,048,721 B2
(45) Date of Patent: Nov. 1, 2011

(54) METHOD FOR FILLING MULTI-LAYER CHIP-STACKED GAPS

(75) Inventors: Hung-Hsin Hsu, Hsinchu (TW); Wei-Chih Chien, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/727,033

(22) Filed: Mar. 18, 2010

(65) Prior Publication Data

US 2011/0230012 A1    Sep. 22, 2011

(51) Int. Cl.
*H01L 21/00* (2006.01)

(52) U.S. Cl. ......... 438/126; 257/E21.503; 257/E21.512; 427/96.1; 264/272.13

(58) Field of Classification Search ............ 438/126; 257/E21.503, E21.512; 264/272.13; 427/96.1, 427/96.2, 443.2
See application file for complete search history.

(56) References Cited

U.S. PATENT DOCUMENTS

| | | | |
|---|---|---|---|
| 2005/0009259 A1* | 1/2005 | Farnworth | 438/200 |
| 2007/0178244 A1* | 8/2007 | Torii et al. | 427/430.1 |
| 2009/0239336 A1* | 9/2009 | Lee et al. | 438/107 |
| 2011/0042820 A1* | 2/2011 | Knickerbocker | 257/774 |

FOREIGN PATENT DOCUMENTS

JP    2003-064186    *    3/2003

OTHER PUBLICATIONS

Translation of JP 2003-064186. Mar. 3, 2003, Uchida et al (7 pages).*

* cited by examiner

*Primary Examiner* — Caridad Everhart
(74) *Attorney, Agent, or Firm* — Muncy, Geissler, Olds & Lowe, PLLC (57) ABSTRACT

A method for filling multi-layer chip-stacked gaps is revealed, primarily comprising the steps as below. Firstly, a chip-stacked assembly is provided, comprising a substrate and a plurality of chips vertically stacked on the substrate where at least a first underfilling gap is formed between each two adjacent ones of the stacked chips with a height difference from the substrate. Then, the chip-stacked assembly is flipped and dipped into an underfilling material where the underfilling material is disposed in a storage tank in a flowing state to completely fill the first underfilling gap. Then, the chip-stacked assembly is taken out. Finally, the chip-stacked assembly is heated to cure the underfilling material filled in the first underfilling gap. Accordingly, multi-layer chip-stacked gaps with different heights can be simultaneously filled at one single step. The conventional underfilling difficulty of multi-layer chip-stacked gaps can be solved leading to higher productivity.

8 Claims, 6 Drawing Sheets

METHOD FOR FILLING MULTI-LAYER CHIP-STACKED GAPS

FIELD OF THE INVENTION

The present invention relates to a manufacturing technology of semiconductor devices, and more particularly to a method for filling multi-layer chip-stacked gaps.

BACKGROUND OF THE INVENTION

For the existing flip-chip (FC) or wafer-level chip-scale packages (WLCSP), the soldering points between a chip and a substrate is vulnerable to breaks due to external forces or thermal stresses causing damages to an IC chips leading to internal interconnection failure during drop tests and reliability tests. Therefore, using underfilling material between the chip and the substrate to protect the soldering points are essential to achieve good product reliability. The conventional underfilling method is to dispense an underfilling material along one side of the substrate with appropriate heat to make the underfilling material fluid then flow into the gap between an IC chip and a substrate through capillary attraction.

Vertically stacking a plurality of chips in flip-chip or in WLCSP (Wafer Level Chip Scale package) formats become the major trend in the advanced packaging technologies. Through Silicon Via (TSV) is also implemented as electrical interconnections between stacked chips, however, multi-layer gaps will be formed between stacked chips at different heights above the substrate. Therefore, the conventional dispensing can not be implemented to underfill the gaps between adjacent stacked chips.

Figure 1:
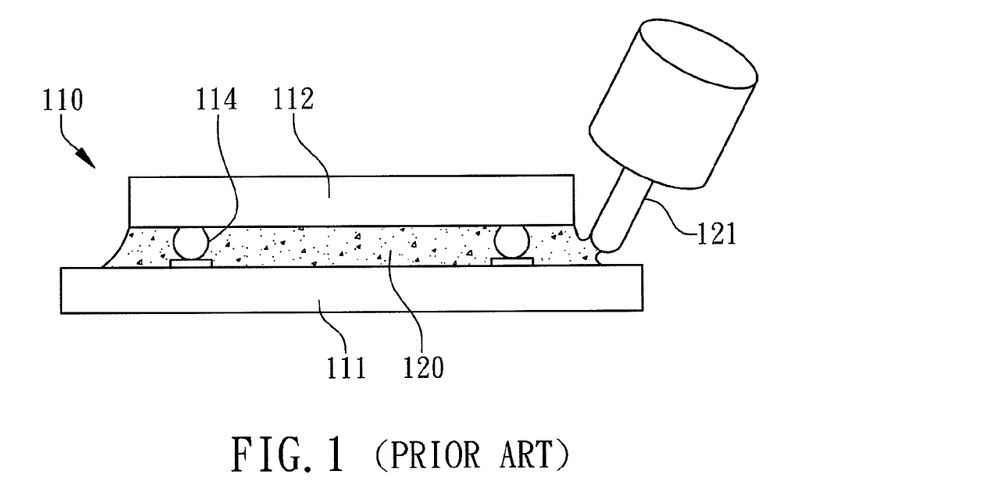
FIG. 1 is a cross-sectional view of a conventional chip-stacked assembly during conventional underfilling processes.

As shown in FIG. 1, a conventional 2D chip assembly 110 is implemented to dispose the underfilling material by dispensing. A dispensing head 121 provides and disposes uncured fluids of underfilling material 120 on the substrate 111 along the side of the chip 112 where the dispensed area of the substrate 111 is not covered by the chip 112. The substrate 111 has to be heated to an appropriate temperature to make the underfilling material 120 fluid but without curing. Then through the high mobility at a specific temperature, the underfilling material 120 will fill into the gap between the substrate 111 and the chip 112 by the capillary attraction to encapsulate the interconnect terminals 114 such as bumps. Finally, at an even higher temperature, the underfilling material 120 is cured to complete the chip assembly 110.

However, when there are multi-layer gaps in a 3D IC assembly with different heights from the substrate, the underfilling material can not fill into the multi-lay gaps through the conventional dispensing. Moreover, the temperatures of the underfilling material can not be well-controlled by only heating the substrate since any variations of temperature gradients will have different capillary attraction for underfilling leading to voids trapped in the multi-layer gaps between two adjacent stacked chips where these voids will be expanded and even exploded during high-temperature processes during the manufacture or operation environments leading to serious product reliability issues.

SUMMARY OF THE INVENTION

The main purpose of the present invention is to provide a method for filling multi-layer chip-stacked gaps to overcome the conventional underfilling issues of multi-layer gaps with different heights from the substrate.

The second purpose of the present invention is to provide a method for filling multi-layer chip-stacked gaps to breakthrough the conventional underfilling limitation of only filling one-layer gap through heating the substrate to enable capillary attraction and to achieve filling multi-layer gaps through one underfilling process leading to higher productivity.

According to the present invention, a method for filling multi-layer chip-stacked gaps is revealed. Firstly, a chip-stacked assembly is provided, comprising a substrate and a plurality of chips vertically stacked on an upper surface of the substrate where at least a first underfilling gap is formed between two adjacent stacked chips with a height difference from the substrate. Then, the chip-stacked assembly is flipped and dipped so that the chips are immersed into underfilling material where the underfilling material is disposed and flows in a storage tank to completely fill the first underfilling gap. Then, the chip-stacked assembly is taken out. Finally, the chip-stacked assembly is heated to cure the underfilling material filled in the first underfilling gap.

The method for filling multi-layer chip-stacked gaps according to the present invention have the following advantages and functions:

1. Through flipping and dipping the chip-stacked assembly in the flowing underfilling material as a technical mean, the conventional underfilling issues of underfilling multi-layer chip-stacked gaps with different heights from the substrate can be overcome.
2. Through flipping and dipping the chip-stacked assembly in the flowing underfilling material as a technical mean, the temperature during underfilling processes can be well-controlled by disposing and flowing the underfilling material in a storage tank so that the voids formed during underfilling processes can be eliminated and the conventional underfilling limitation of only filling one-layer gap through heating the substrate can be broken to enable capillary attraction and to achieve filling multi-layer gaps through one underfilling process leading to higher productivity.
3. Through flipping and dipping the chip-stacked assembly in the flowing underfilling material as a technical mean, the chips and the electrical connecting points will not be exposed to the atmosphere causing oxidation leading to electrical open and will not be contaminated by foreign materials leading to electrical short and to further eliminate the encapsulation of molding compounds to achieve thinner profile of 3D IC packages.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

According to the first embodiment of the present invention, a method for filling multi-layer chip-stacked gaps is illustrated from FIG. 2 to FIG. 6 for cross-sectional views of a chip-stacked assembly 210.

Figure 2:
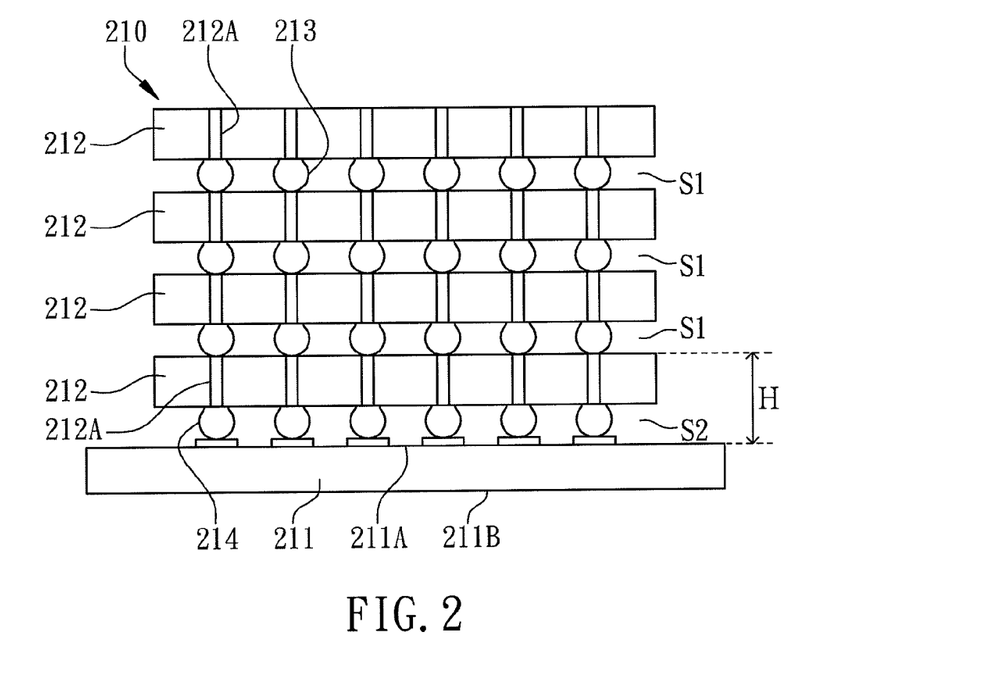
FIG. 2 is a cross-sectional view of a chip-stacked assembly provided by the method for filling multi-layer chip-stacked gaps according to the first embodiment of the present invention.

The method for filling multi-layer chip-stacked gaps according to the present invention primarily comprises the following processes. Firstly, as shown in FIG. 2, the chip-stacked assembly 210 is provided. The chip-stacked assembly 210 comprises a substrate 211 and a plurality of chips 212 vertically stacked on the substrate 211. The substrate 211 serves as the functions of carrying the chips 212 and transiting the electrical signals which can be a printed circuit board, a ceramic substrate, or a larger-dimension chip. The substrate 211 has an upper surface 211A and a bottom surface 211B where the chip 212 are vertically stacked on the upper surface 211A. The chips 212 are 3D disposed on the substrate 211, not side-by-side disposed. The stacking number of chips is not limited and can be as high as eight to increase memory capacity or to expand more functions. Furthermore, the chips 212 can all be the same semiconductor chips with the same chip dimensions and structures where the chips 212 usually are flip-chip dices or WLCSP. The electrical interconnections between the stacked chips 212 are formed by a plurality of through silicon vias (TSV) 212A disposed inside the chips and a plurality of interconnect terminals 213 between the chips.

At least a first underfilling gap S1 is formed between two adjacent stacked chips 212 with a height difference H from the substrate 211 where the height H is approximately the total height of the bottommost chip and the interconnect terminals 214 which is normally larger than a chip thickness. The first underfilling gap S1 is the underfilling gap between the stacked chips 212 not including the underfilling gap between the bottommost chip 212 and the substrate 211. Furthermore, a second underfilling gap S2 is formed between the substrate 211 and the bottommost one of the stacked chips 212 adjacent to the substrate 211. The first underfilling gap S1 is higher than the second underfilling gap S2.

The internal electrical interconnections of the chip-stacked assembly 210 are further described in detail as follows. The interconnect terminals 213 are disposed in the first underfilling gaps S1 to electrically connect between the stacked chips 212. Furthermore, the chip-stacked assembly 210 further comprises a plurality of interconnect terminals 214 disposed in the second underfilling gap S2 to electrically connect the bottommost one of the stacked chips 212 and the substrate 211. In one embodiment, the interconnect terminals 213 and/or 214 are disposed on the active surface of the chips 212 where the chips 212 are flipped bonded to the substrate 211. To be in more details, the interconnect terminals 213, 214 can be reflowable bumps or non-reflowable bumps such as solder bumps, gold bumps, copper bumps, aluminum bumps, or polymer conductive bumps where the shapes of the interconnect terminals 213, 214 can be cubes, cylinders, rods, half-sphere, or spheres and are electrically and mechanically bonded to the bonding pads of the chips 212 or the substrate 211. The interconnect terminals 213, 214 can be formed by electroplating, electroless plating, evaporation, ball attachment, ball placement, stencil printing, Au stud bumping, or solder jet. The interconnect terminals 213, 214 have heights such as 3 to 10 um (micrometer) to form the first underfilling gap S1 between two adjacent stacked chips 212 and to form the second underfilling gap S2 between the bottommost one of the stacked chips 212 and the substrate 211. Furthermore, as shown in FIG. 2, each chip 212 has a plurality of vertically disposed TSV 212A which are through holes disposed inside and penetrated through the chips 212 where conductive materials are filled inside the through holes such as electroplated layers, conductive paste applied in liquid form, solder paste, or other conductive materials. Each interconnect terminal 213 or 214 is disposed under each TSV 212A along the same vertical line to enable vertical electrical interconnection between the stacked chips 212 to effectively shorten the signal transmission distances.

Figure 3A:
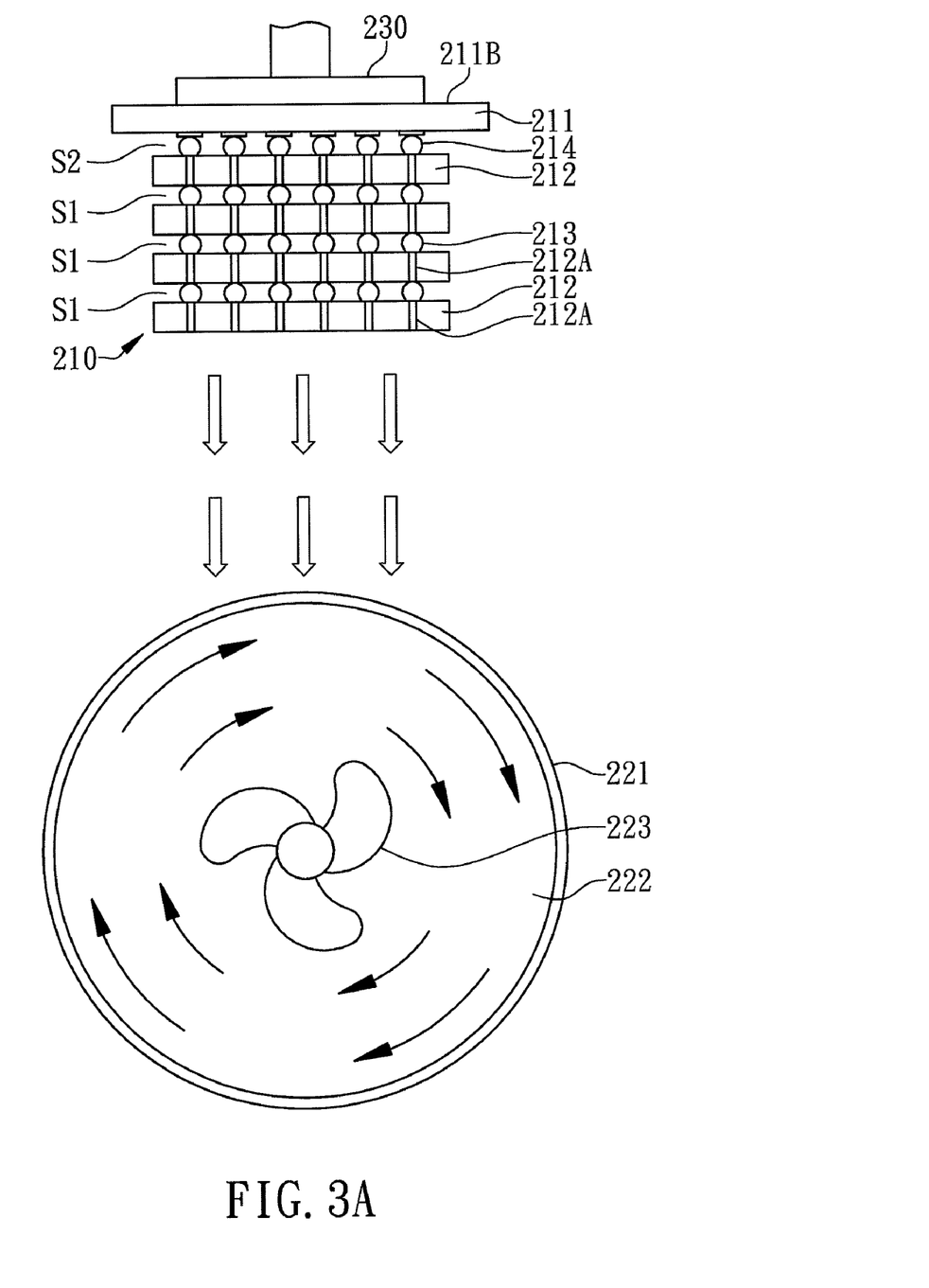
FIG. 3A and FIG. 3B are top views and cross-sectional views of a storage tank illustrating the step of flipping and dipping the chip-stacked assembly during the method for filling multi-layer chip-stacked gaps according to the first embodiment of the present invention.
Figure 3B:
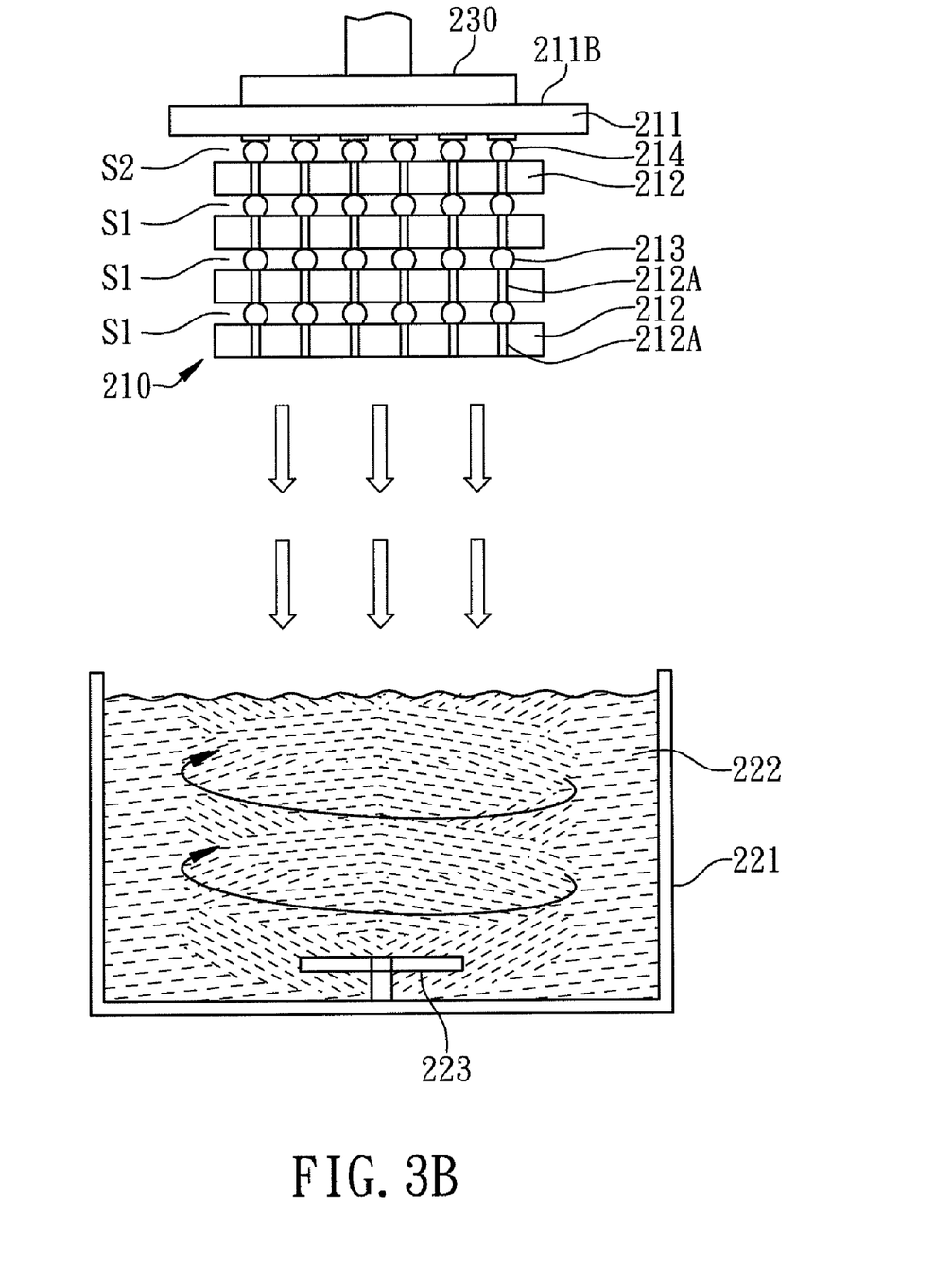
Figure 4:
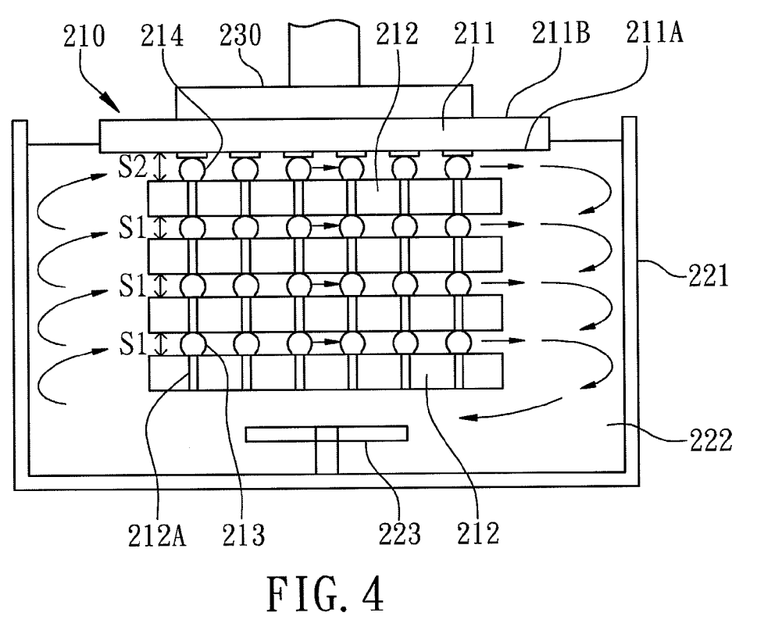
FIG. 4 is a cross-sectional view of the chip-stacked assembly flipped and dipped in flowing underfilling material according to the first embodiment of the present invention.

Then, a flipping and dipping step is performed. As shown in FIG. 3A and FIG. 3B, firstly, the chip-stacked assembly 210 is flipped so that the chips 212 orient to a storage tank 221. To be more specific, when the chip-stacked assembly 210 is flipped, a chuck 230 or a sucking disc is used to chuck the bottom surface 211B of the substrate 211 to firmly hold the chip-stacked assembly 210. Additionally, an underfilling material 222 is disposed in the storage tank 221 and kept in a flowing state. The underfilling material 222 is liquid-type thermal-setting dielectric resin with higher mobility such as epoxy compound. Preferably, a mixer 223 is disposed at the bottom surface of the storage tank 221 where the mixer 223 a stirring blade or a stirring rod which is mechanically connected to a power axis of an external motor (not shown in the figure) to rotate the mixer 223 to make the underfilling material 222 inside the storage tank 221 flowing to further enhance the underfilling processes. Next, as shown in FIG. 4, the chip-stacked assembly 210 is dipped so that all of the chips 212 are immersed into the underfilling material 222 until the first underfilling gap S1 is completely filled. In the present embodiment, the second underfilling gap S2 is completely filled simultaneously. Referring to arrow directions in FIG. 3A and FIG. 3B, the chuck 30 can be lowered to dip the chip-stacked assembly 210 into the storage tank 221 to further control the dipping depth of the chip-stacked assembly 210. Preferably, as shown in FIG. 4, during the above described dipping processes, the bottom surface 211B of the substrate 211 is not covered by the underfilling material 222 to be the suction surface for the chip-stacked assembly 210 for the chuck 230. In the present embodiment, the substrate 211 is not fully dip into the underfilling material 222 but the second underfilling gap S2 is completely filled by the underfilling material 222. Because the underfilling material 222 in the storage tank 221 is continuously kept in a flowing state, the underfilling material 222 can smoothly and completely fill in the first underfilling gap S1 and the second underfilling gap S2.

More preferably, as shown in FIG. 3A, FIG. 3B and FIG. 4, the storage tank 221 is a cylinder to make the flowing of underfilling material 222 as a vortex as shown by the arrows in FIG. 3A and FIG. 3B. The flowing speed at the peripheries of the underfilling material 222 can be steady and the liquid level at the center of the storage tank 221 can be kept constant without covering to the bottom surface 211B of the substrate 211. When the flowing speed and the temperature of the underfilling material 222 can be well-controlled by storing in the storage tank 221, the underfilling material 222 will smoothly and evenly flow into the first underfilling gap S1 and the second underfilling gap S2. During underfilling processes, the temperature of the underfilling material 222 can be well-controlled through disposing and flowing the underfilling material 222 in a storage tank 222. The filling effect is stable and better than the conventional filling method of using capillary attraction.

Accordingly, comparing to the conventional dispensing method of underfilling material on a heated substrate, the flipping and dipping step in the invention can break through the conventional limitation of only filling one-layer underfilling gap by capillary attraction and achieve filling multi-layer gaps such as S1 and/or S2 through one single underfilling process leading to higher productivity.

In a preferable present embodiment, the chip-stacked assembly 210 may be laid in a vacuum environment during the flipping and dipping step to avoid voids formed when the underfilling material 222 is filled into the first underfilling gap S1 and the second underfilling gap S2. Alternatively, the chip-stacked assembly 210 can be shaken at atmospheric pressure to eliminate voids.

Figure 5:
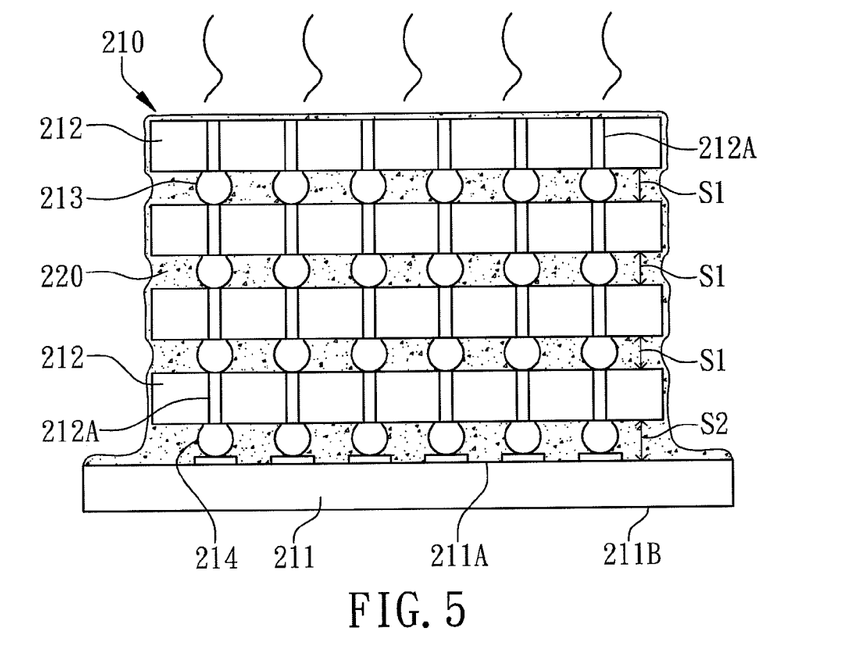
FIG. 5 is a cross-sectional view of the chip-stacked assembly after taking out during the heating step according to the first embodiment of the present invention.

Then, as shown from FIG. 4 to FIG. 5, the chip-stacked assembly 210 is taken out from the storage tank 221. After taking out the chip-stacked assembly 210, the underfilling material adhered to the chip-stacked assembly 210 is numbered as 220 where chips 212 are completely encapsulated by the underfilling material 220 including the active surfaces, the side walls, the back surfaces of the chips 212, especially the back surface of the uppermost chip, and the upper surface 211A of the substrate 211 is also encapsulated by the underfilling material 220. The underfilling material 220 adhered to the chip-stacked assembly 210 is assigned to show the difference from the underfilling material 222 disposed inside the storage tank 221. After dipping and taking out the chip-stacked assembly 210, the underfilling material 220 completely fill the first underfilling gap S1 and the second underfilling gap S2 to overcome the conventional underfilling issues due to a height difference between the multi-layer gaps and the substrate which can not be accomplished by dispensing.

Finally, as shown in FIG. 5, the chip-stacked assembly 210 is heated to cure the underfilling material 220 filled inside the first underfilling gap S1 where the heating temperature should be higher than the temperature of the storage tank 221 to induce irreversible permanent curing reaction so that the gaps between the adjacent chips 212 and the gaps between the bottommost chip 212 and the substrate 211 can be completely filled without any voids. The cured underfilling material 220 become solid resins with good sealing, good chemical stability, and good isolation to encapsulate the chips 212 and the interconnect terminals 213 and 214 as soldering points which is not damaged caused by thermal stresses due to CTE mismatching between the chips 212 and the substrate 211 and will not be contaminated by foreign materials. Moreover, the interconnect terminals 213, 214 are well protected without exposing to the environment leading to electrical short. Therefore, the underfilling material 220 after curing can completely encapsulate the chips 212 and the upper surface 211A of the substrate 212, especially, the back surface of the topmost chip 212, i.e., to encapsulate the exposed terminals of TSV 212A from the surface of the topmost chip 212 so that the chips 212 and the electrical contact points are not exposed to the atmosphere causing oxidation leading to electrical open or to foreign materials causing contaminations leading to electrical short. Moreover, the conventional molding compound can be eliminated to achieve thinner packages of 3D stacked IC chips.

Figure 6:
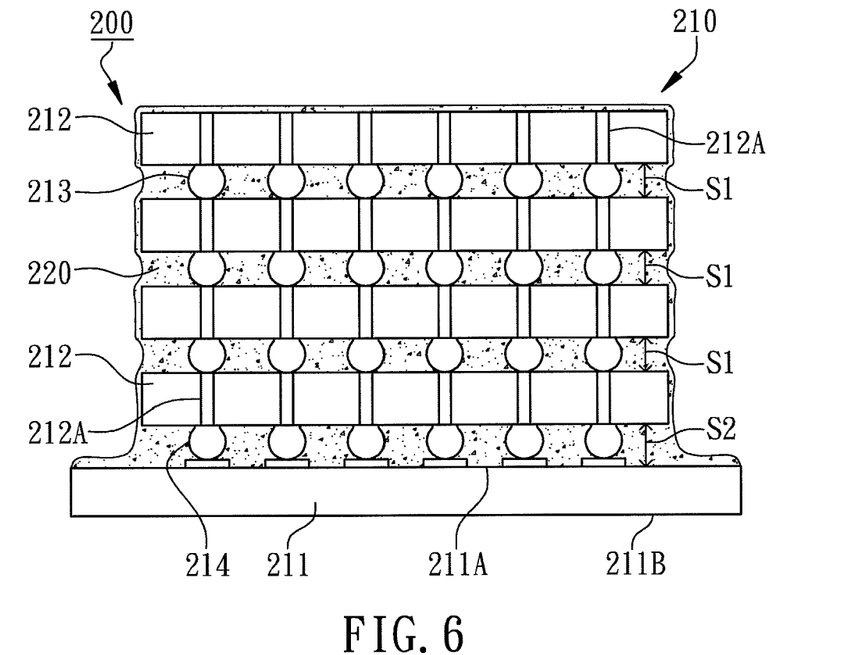
FIG. 6 is a cross-sectional view of the chip-stacked assembly fabricated by the method for filling multi-layer chip-stacked gaps according to the first embodiment of the present invention.

As shown in FIG. 6, a semiconductor device having the structure of multi-layer underfilling gaps fabricated by the method is also revealed. In the present invention, the semiconductor device is formed after the chip-stacked assembly 210 is cured. The semiconductor device 200 comprises an above described chip-stacked assembly 210 and an underfilling material 220 formed by dipping where the detail description has been illustrated in the above method which will not be explained again.

According to the first embodiment of the present invention, the above mentioned processes can be implemented not only on a single substrate but also on a substrate strip where the substrate 211 is a substrate strip. A plurality of chips 212 are vertically stacked in each packaging unit for mass production of thin packages for semiconductor devices. The method for filling multi-layer chip-stacked gaps can be implemented to underfill two or more chip-stacked assembly 210 as well as to avoid voids formed inside the chip-stacked assembly 210 at the same time. Even with flooding, the underfilling material 220 will flood to the non-package areas on the bottom surfaces of the substrate strips without flooding to the bottom surfaces of the packaging units. During dipping processes, all the chips 212 can be completely encapsulated by the underfilling material 220 inside the same storage tank 221 to further enhance the productivity, reliability, and life time of the semiconductor devices.

Figure 7:
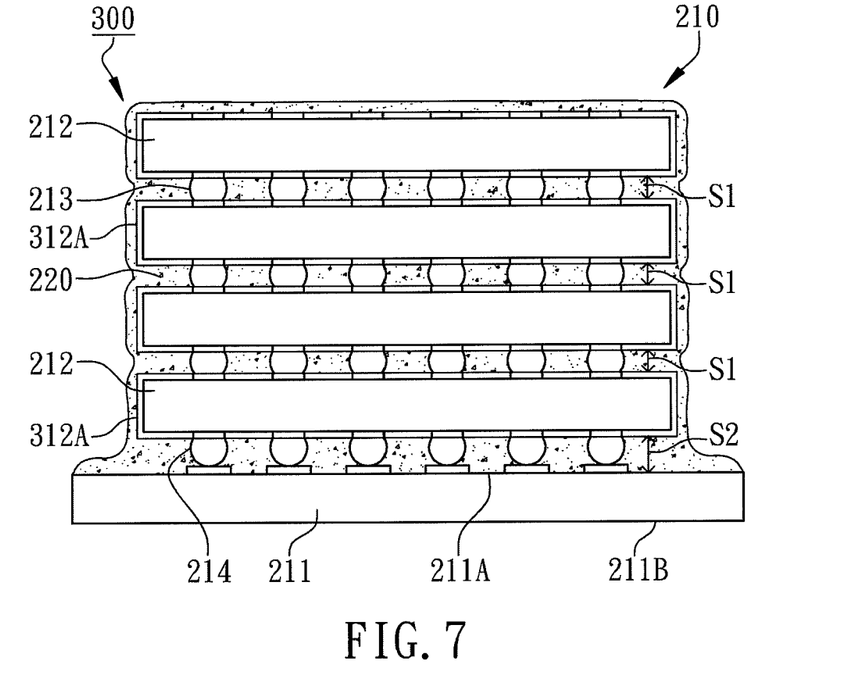
FIG. 7 is a cross-sectional view of another chip-stacked assembly fabricated by the method for filling multi-layer chip-stacked gaps according to the second embodiment of the present invention.
Figure 8:
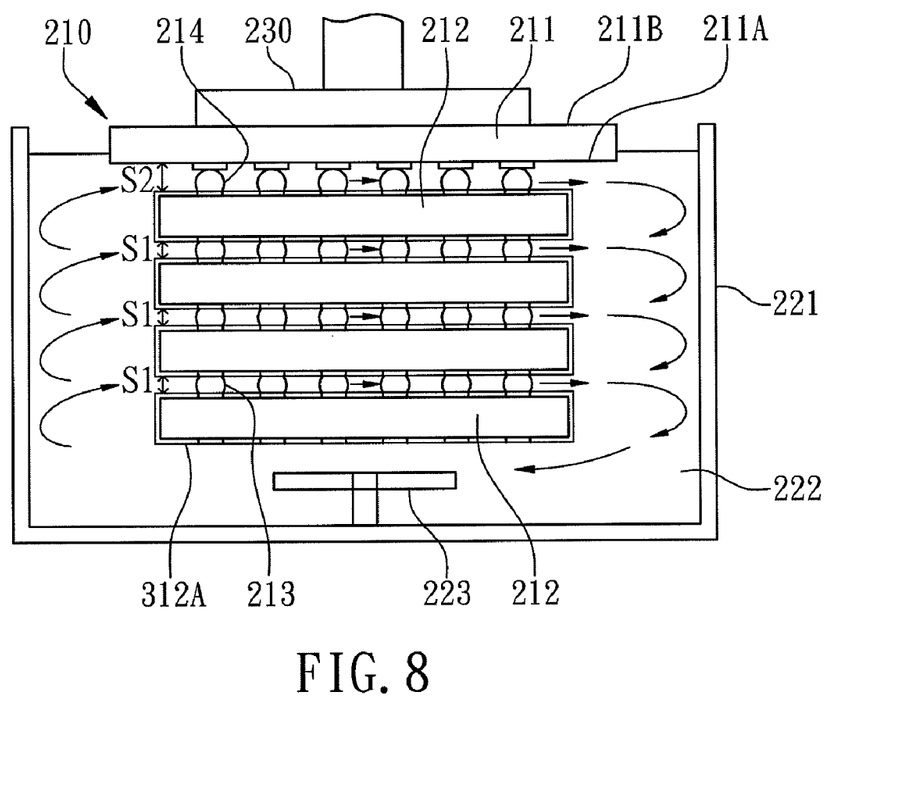
FIG. 8 is a cross-sectional view of the chip-stacked assembly flipped and dipped in flowing underfilling material according to the second embodiment of the present invention.

According to the second embodiment of the present invention, another method for filling multi-layer chip-stacked gaps is illustrated in FIG. 7 and FIG. 8 for cross-sectional views of another chip-stacked assembly 210. The primary processes of the method for filling multi-layer chip-stacked gaps are about the same as the first embodiment. The processes are the same as the first embodiment with the same described components and numbers to present the same functions and purposes which will not be explained again. Firstly, the chip-stacked assembly 210 is provided. Then, the chip-stacked assembly 210 is flipped and dipped so that the chips 212 are immersed into an underfilling material 222 flowing in a storage tank 221. Then, the chip-stacked assembly 210 is taken out, the underfilling material adhered to the chip-stacked assembly 210 is numbered as 220. Finally, the chip-stacked assembly 210 is heated to cure the underfilling material 220. Accordingly, a semiconductor device 300 comprising an above described chip-stacked assembly 210 and an underfilling material 220 is fabricated.

In the present embodiment, the chips 212 are flip-chip dices where a redistribution wiring layer 312A is disposed on a back surface of each chip 212. The redistribution wiring layer 312A is formed on the back surface routing through the sidewalls and extending to the active surface of the corresponding chip 212 to directly connect to the corresponding interconnect terminals 213, 214 so that the chips 212 can be vertically stacked and electrically connected to each other. To be more specific, the redistribution wiring layer 312A is formed by electroless plating, sputtering, PVD, or CVD.

As shown in FIG. 8, when dipping the chip-stacked assembly 210, the underfilling material 222 in the storage tank 221 can smoothly and evenly flow into the first underfilling gap S1 and the second underfilling gap S2. As shown in FIG. 7, after curing the underfilling material 220 adhered to the chip-stacked assembly 210, the underfilling material 220 can completely encapsulate the chips 212 and the upper surface 211A of the substrate 211 to prevent the risk of the redistribution wiring layer 312A exposing to the atmosphere causing oxidation leading to electrical open or exposing to foreign materials causing contamination leading to electrical short.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A method for filling multi-layer chip-stacked gaps comprising:
    providing a chip-stacked assembly comprising a substrate and a plurality of chips vertically stacked on an upper surface of the substrate to form at least a first underfilling gap between two adjacent stacked chips with a height difference from the substrate;
    flipping and dipping the chip-stacked assembly so that all of the chips are completely immersed into an underfilling material disposed and flowing inside a storage tank until the first underfilling gap is completely filled, while a lower surface of the substrate is located above a liquid level of the underfilling material without being covered by the underfilling material;
    taking out the chip-stacked assembly; and
    heating the chip-stacked assembly to cure the underfilling material filled inside the first underfilling gap.

2. The method as claimed in claim 1, wherein the underfilling material completely encapsulates the chips after the taking-out step of the chip-stacked assembly.

3. The method as claimed in claim 1, wherein the storage tank is a cylinder having a mixer disposed at a bottom center of the storage tank to make the flowing of the underfilling material as a vortex.

4. The method as claimed in claim 1, wherein a second underfilling gap is formed between the bottommost one of the stacked chips and the substrate and is also completely filled by the underfilling material during the flipping and dipping step.

5. The method as claimed in claim 1, wherein the chip-stacked assembly is laid in a vacuum environment during the flipping and dipping step.

6. The method as claimed in claim 1, wherein the chip-stacked assembly further comprises a plurality of interconnect terminals disposed in the first underfilling gap and electrically connecting the stacked chips during the providing step of the chip-stacked assembly.

7. The method as claimed in claim 6, wherein each chip has a plurality of through silicon vias inside for vertical electrical connections.

8. The method as claimed in claim 6, wherein the chips are flip-chip dices with a redistribution wiring layer disposed on a back surface of each chip.

* * * * *